United States Patent

[11] 3,594,647

[72] Inventor Koichi Ishigaki
Osaka-shi, Japan

[21] Appl. No. 661,623
[22] Filed Aug. 18, 1967
[45] Patented July 20, 1971

[73] Assignee Matsushita Electric Industrial Co., Ltd.
Osaka, Japan

[54] VHF TUNER SWITCHING SYSTEM ROTATING DISC TYPE UHF-VHF TUNER SWITCHING DEVICE
6 Claims, 13 Drawing Figs.

[52] U.S. Cl. .......... 325/461, 334/49
[51] Int. Cl. .......... H04b 1/06
[50] Field of Search .......... 325/458, 459, 461, 462, 464, 465; 334/1, 2, 49, 50; 339/247, 251; 200/28, 30, 23

[56] References Cited

UNITED STATES PATENTS

| | | | |
|---|---|---|---|
| 2,773,986 | 12/1956 | Thias et al. | 334/50 |
| 2,772,354 | 11/1956 | Browder | 334/2 X |
| 2,706,252 | 4/1955 | Overman | 334/50 |
| 2,795,660 | 6/1957 | Keller et al. | 334/50 UX |
| 2,802,946 | 8/1957 | Feigl | 334/49 |
| 2,810,827 | 10/1957 | Nordby | 334/50 X |
| 3,099,808 | 7/1963 | Hobley | 334/50 |

*Primary Examiner*—Richard Murray
*Assistant Examiner*—R. S. Bell
*Attorney*—Wenderoth, Lind & Ponack

ABSTRACT: This invention concerns a VHF tuner switching system designed for selecting from among signals in the VHF and the UHF band waves in a combined VHF-UHF tuner. Said switching system comprises a first disc, a pair of discs and a second disc, all secured to a rotor shaft of the tuner. Each of said discs has a plurality of rotor contacts, having coils connected thereto, located around its periphery. The coils positioned on said first disc are for input circuits of the VHF tuner; those positioned on said pair of discs are for an inter stage double tuning circuit; and those positioned on said second disc control a local oscillator circuit. The selection of a signal in the VHF band is achieved by the engagement between said plurality of rotor contacts and a pair of stator contacts which are in contact with each of said discs during the rotation of said shaft. Said pair of stator contacts of said first disc are connected to an amplifier of the VHF tuner and to a VHF antenna, respectively. A third stator contact is connected to the output of the UHF tuner so that, when said rotor shaft is positioned for selecting signals from the UHF band wave, said output of the UHF tuner is connected to a first stage amplifier of the VHF tuner. Said pair of stator contacts of the second disc are connected to a local oscillator and to a power supply, respectively. They are accompanied by a third stator contact connected to the UHF tuner in such a way that a power supply is switched from said VHF tuner to said UHF tuner when said rotor shaft is in position for selecting signals from the UHF band wave.

INVENTOR

KOICHI ISHIGAKI

BY, Wenderoth, Lind & Ponack

ATTORNEYS

INVENTOR
KOICHI ISHIGAKI

BY, Wenderoth, Lind & Ponack
ATTORNEYS

INVENTOR
KOICHI ISHIGAKI
BY Wenderoth, Lind & Ponack
ATTORNEYS

INVENTOR

KOICHI ISHIGAKI

BY Wenderoth, Lind & Ponack

ATTORNEYS

VHF TUNER SWITCHING SYSTEM ROTATING DISC TYPE UHF-VHF TUNER SWITCHING DEVICE

BACKGROUND OF THE INVENTION

1. Field of the Invention

This invention relates to a VHF tuner switching system adapted for a television set capable of receiving both VHF and UHF broadcasts.

2. Description of the Prior Art

In the prior art, a combination of UHF and a VHF tuner was employed in television sets for receiving a signal from the UHF band wave. In order to operate the UHF tuner, it was necessary to position the VHF tuner in the UHF receiving position. This switching action disconnected the VHF input form the circuit and at the same time connected the output of the UHF tuner to the amplifier circuit. It also switched the power, which is supplied to the oscillator under VHF operating conditions, from the oscillator to the input of the UHF tuner. In a conventional-type switch or in a rotating disc-type tuner, the switching system was usually mounted on the outside of the tuner chassis and operated by rotating the rotor shaft of the tuner. Said externally mounted switching system resulted in a tuner which was large in size and which required a large rotational torque to turn the rotor shaft. For the above reasons, the VHF switching system has prevented the miniaturization of the VHF–UHF tuner. Another disadvantage of the tuners known in the prior art is that, due to the external mounting of the VHF tuner, the input circuit of the tuner is exposed and thus apt to pick up interference.

SUMMARY OF THE INVENTION

An object of the present invention is to provide a VHF tuner in which the switching means for selecting from among the VHF and the UHF band waves is mounted internally of the tuner chassis and in which said switching means is small in size.

Another object of the present invention is to provide a VHF tuner containing a shaft which can be rotated by applying a small rotational torque.

A further object of the present invention is to provide a VHF tuner in which interference pickup is prevented by mounting said VHF switching system within the chassis of the tuner.

A still further object of the present invention is to provide a VHF tuner having a simple construction and a lower cost.

These objectives are achieved by the VHF tuner switching system of this invention. Said switching system, designed for selecting from among signals in the VHF and the UHF band waves in a combined VHF–UHF tuner, comprises a first disc, a pair of additional discs and a second disc, all secured to the rotor shaft of the tuner. Each of said discs has a plurality of rotor contacts having coils connected thereto and located around its periphery. The coils positioned on said first disc are for input circuits of the VHF tuner; those positioned on said pair of additional discs are for an inter stage double tuning circuit, and those positioned on said second disc control a local oscillator circuit. The selection of a signal in the VHF band is achieved by the engagement between said plurality of rotor contacts and a pair of stator contacts which are in contact with each of said discs during the rotation of said shaft. Said pair of stator contacts of said first disc are connected to an amplifier for the VHF tuner and to a VHF antenna, respectively. A third stator contact is connected to the output of the UHF tuner so that when said rotor shaft is positioned for selecting signals from the UHF band wave, said output of the UHF tuner is connected to a first stage amplifier of the VHF tuner. Said pair of stator contacts of the second disc are connected to a local oscillator and to a power supply, respectively. Associated therewith is a third stator contact connected to the UHF tuner in such a way that a power supply is switched from said VHF tuner to said UHF tuner when said rotor shaft is positioned for selecting signals from the UHF band wave.

BRIEF DESCRIPTION OF THE DRAWINGS

These and other objects of the present invention will become clearer from the following detailed description taken together with the accompanying drawings wherein.

DESCRIPTION OF A PREFERRED EMBODIMENT

Figure 1:
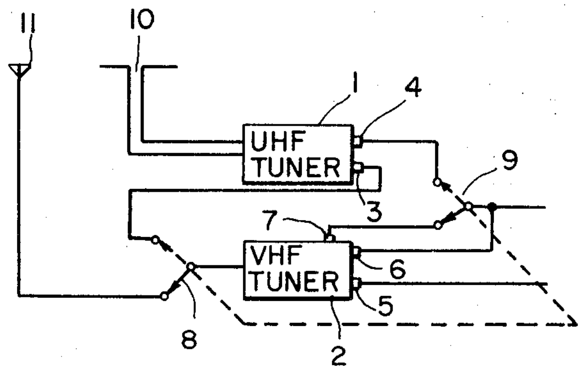
FIG. 1 is a block diagram illustrating the switching system between a VHF tuner and a UHF tuner.

Referring to the block diagram of a combined VHF–UHF tuner of FIG. 1, the UHF tuner 1 is connected, to one end, of a UHF receiving antenna 10. It includes an intermediate frequency (I.F.) output terminal 13 and a power supply terminal 4 for said UHF tuner. The VHF tuner 2 includes an I.F. output terminal 5, a power supply terminal 6 excluding that for the local oscillator circuit, and a power supply terminal 7 for the local oscillator circuit of the VHF tuner. A VHF receiving antenna 11 is connected to an input switch 8 which in turn is connected to said VHF tuner. A power supply switch 9 is connected to said VHF tuner or to said UHF tuner depending on the receiving state. In FIG. 1, solid lines indicate the connections when the VHF bands are being received and the corresponding dotted lines indicate the connection when the UHF bands are being received.

Figure 2:
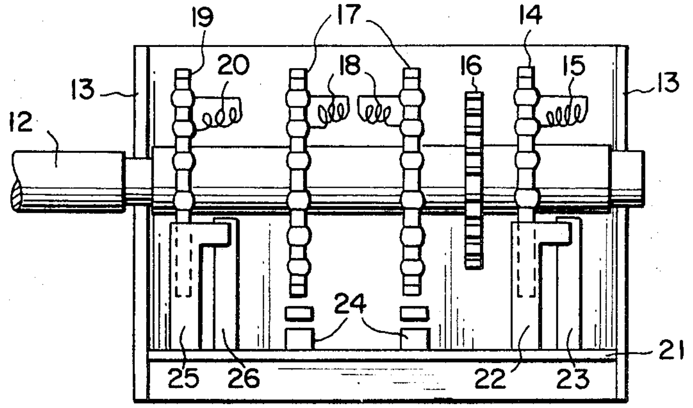
FIG. 2 is a sectional view of a VHF tuner of a rotating disc-type according to the present invention.

Referring to FIG. 2, a disc 14 having coils 15 thereon for an input circuit of the VHF tuner, a pair of additional discs 17 having coils 18 thereon for an inter stage double turning circuit, and a second disc 19 having coils 20 thereon for a local oscillator circuit, are positioned on a rotor shaft 12. A detent cam 16 is also secured to said rotor shaft 12. Each of said discs has a plurality of rotor contacts 28 thereon at the periphery thereof. Said first disc 14 has the periphery thereof engaged with a pair of stator contacts 22 and 27. A third stator contact 23 is positioned so that it can be contacted by contact 22 and connected to an output of the UHF tuner (not shown in FIG. 1). Each of said pair of additional discs 17 has the periphery thereof engaged with a pair of stator contacts 24 which are connected to transistors. Said second disc 19 has the periphery thereof engaged with a pair of stator contacts 25 and 39 and a fourth stator contact 26, connected to the UHF tuner is positioned so that it can be engaged by contact 25. Each of said stator contacts is secured to an insulating sheet 21 which is adhered to the chassis 13 of the tuner.

Figure 3:
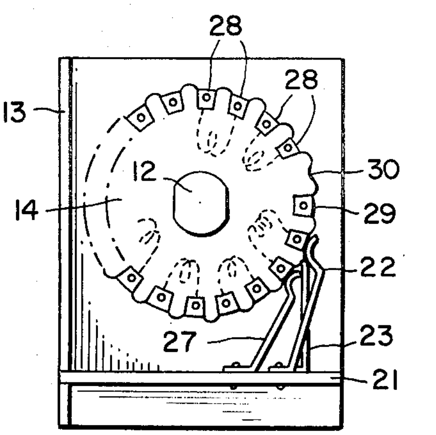
FIG. 3 is a front view of a VHF tuner of a rotating disc-type according to the present invention.
Figure 4:
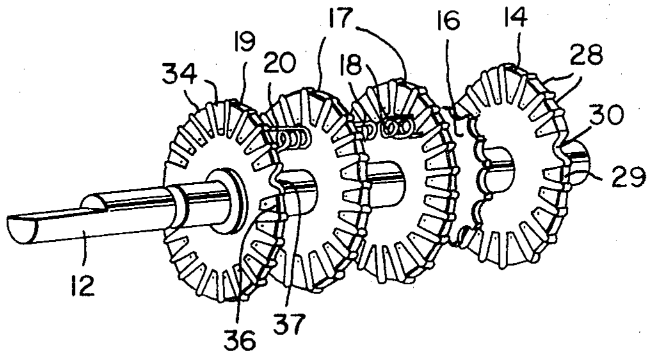
FIG. 4 is a perspective view of the rotary discs and shaft assembly according to the present invention.

Referring to FIG. 3 and FIG. 4, wherein similar reference characters indicate components similar to those of FIG. 1, said first disc 14 has, at its periphery, rotor contacts 28. The number of said contacts positioned on the periphery of the disc 14 is equal to twice the number of VHF channels. Coils 15 necessary for receiving the VHF channels are connected to said rotor contacts 28. Said first disc 14 rotates with the said rotor shaft 12. During said rotation, the rotor contacts 28 are in contact with the respective contacts of said pair of stator contacts 22 and 27. The periphery of said first disc 14 has no rotor contact at a position 30, corresponding to the UHF position of said rotor shaft 12, and at a position 29, adjacent to said position 30. Alternatively a contact can be provided at position 29 which is not connected to any other contact. Said disc has other rotor contacts which are electrically connected to the coils or to other portions of the circuit. When said first disc 14 rotates and comes into contact with said stator contacts 22 and 27 at the positions 29 and 30, said stator contact 22 is sufficiently displaced by its inherent spring action so as to come into contact with stator contact 23 which is connected to the output terminal 3 of the UHF tuner 1.

Said second disc 19 is constructed similar to said first disc 14 with respect to its periphery.

In contrast to the construction of said first disc 14 and said second disc 19, said pair of discs 17 do not have any positions on their peripheries which have no rotor contacts such as position 30 on disc 14, nor are any positions provided with no contact or a rotor contact which is not electrically connected such as the contact in position 29 of disc 14. Referring to FIG. 4, the cutout portions 30 and 37 are positioned at the same angle with respect to the shaft 12.

Figure 5:
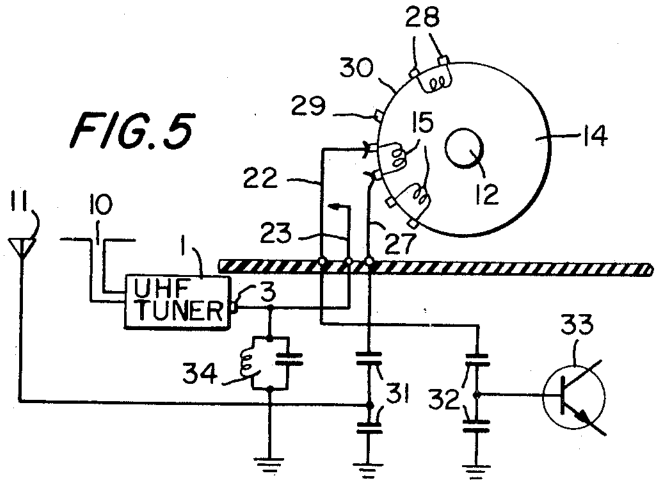
FIG. 5 is a circuit diagram illustrating an antenna circuit of the first disc of the VHF tuner of FIG. 2 when the signals of the VHF bands are being received.

Referring to FIG. 5, a signal in the VHF bands, picked up by the VHF antenna 11, is supplied to the stator contact 27 through capacitors 31 which are provided for impedance matching. Said stator contact 27 is connected, through the rotor contacts 28 of the first disk 14, to the coils 15 and thus picks up the selected VHF signal. The selected signal is supplied through the stator contact 22 to a capacitor 32 which is provided for impedance matching and from there it passes to a first stage transistor 33. No signal is supplied from the UHF tuner because the stator contact 23 is not in contact with the stator contact 22.

Figure 6:
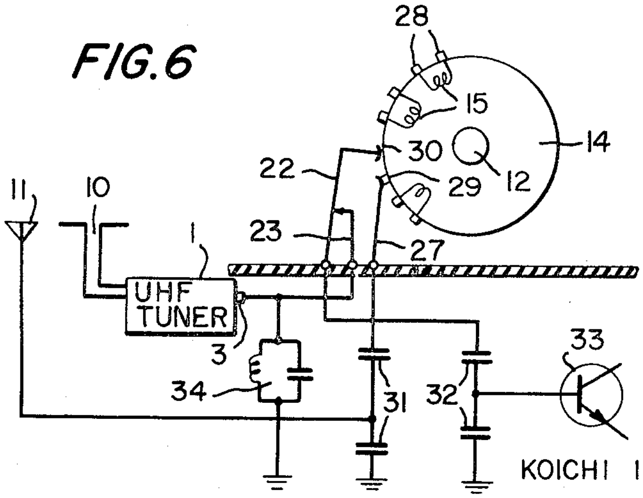
FIG. 6 is a circuit diagram showing the circuit of FIG. 5 when the signals of the UHF band are being received.

Referring to FIG. 6 which illustrates the UHF position of the rotor shaft 12, similar reference characters indicate components similar to those of FIG. 5. Signals of the UHF band picked up by the UHF receiving antenna 10 are supplied to an output terminal 3 of the UHF tuner after being converted into intermediate frequency (I.F.) by the UHF tuner. The intermediate frequency at the output terminal 3 passes through a circuit 34 which is tuned to the intermediate frequency and from there passe to the stator contact 23. The stator contact 27 is in contact with the rotor contact 29 which has no electrical connection. The stator contact 22 faces position 30 which corresponds to the UHF position of the rotor shaft 12. In this position, stator contact 22 is sufficiently displaced to contact the stator contact 23. As a result, the I.F. input passes through the stator contacts 23 and 22 and the capacitor 32 and is in turn supplied to the first stage transistor 33. The VHF antenna is switched off when the rotor shaft is in this position because the stator contact 27 is in contact with the rotor contact 29 which does not have any electrical connections.

Figure 7:
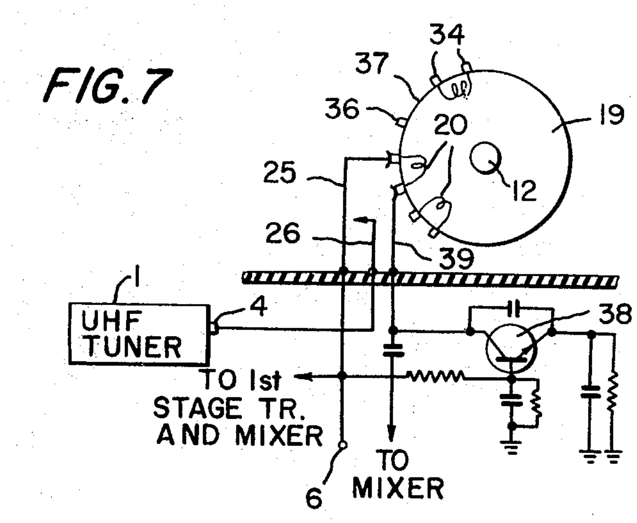
FIG. 7 is a circuit diagram illustrating a local oscillator circuit of the second disc of the VHF tuner of FIG. 2 when signals of the VHF bands are being received.

Referring to FIG. 7 which illustrates the local oscillator circuit of the second disc 19 for receiving the VHF bands, an electric source supplied from the power supply terminal 6 of the VHF tuner is supplied to the first stage transistor and a mixer and simultaneously it is supplied to an oscillator transistor 38 through the rotor contacts 34 which are in contact with the stator contact 25, an oscillating coil 20 and the stator contact 39. The transistor 38 is coupled with the resistors and capacitors necessary for achieving the oscillating action. The UHF tuner is not provided with any electric power because the stator contact 26 is not in contact with the stator contact 25.

Figure 8:
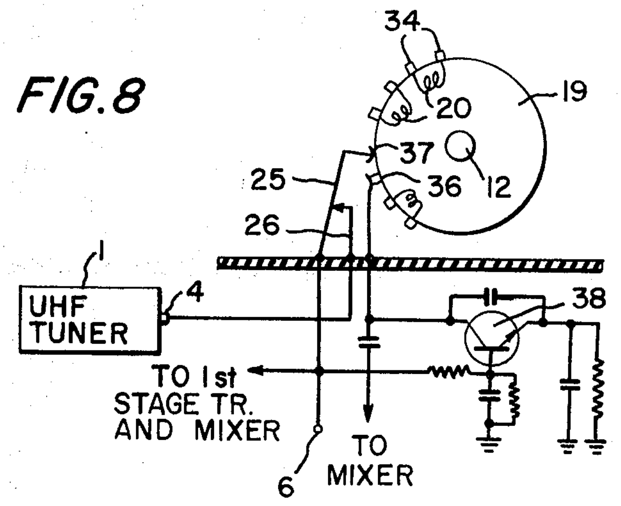
FIG. 8 is a circuit diagram showing the circuit of FIG. 7 when the signals of the UHF bands are being received.

Referring to FIG. 8 wherein the VHF tuner is switched to the position for receiving signals from the UHF band, electric power, supplied from the power supply terminal 6 of the VHF tuner is supplied to the first stage amplifier and the mixer as well as to the stator contact 25. The transistor 38 is not provided with a collector current because contact 39 is in contact with the rotor contact 36 which does not have any electrical connection and therefore stops oscillating. The stator contact 25 faces position 37 on the disc 19, which corresponds to the UHF position of the rotor shaft 12. In this position said contact is displaced so as to come into contact with the stator contact 26 which is connected to the power supply terminal 4 of the UHF tuner 1. As a result, the UHF tuner is provided with electric power and thus put into operation.

Said switching action of the first disc 14 and of the second disc 19 is achieved simultaneously at the UHF position of the rotor shaft 12. Therefore, for convenience, the explanation of the switching action will hereinafter be made only with reference to the first disc.

Figure 9:
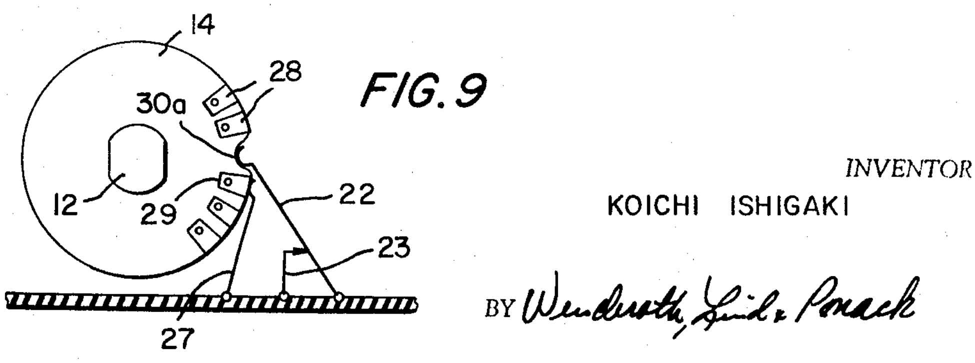
FIG. 9 is a schematic diagram of the first disc illustrating an embodiment of the present invention.

Referring to FIG. 9, the first disc 14 has a cutout portion $30^a$ on its periphery corresponding to the UHF position of the rotor shaft 12. Said cutout portion $30^a$ is not provided with a rotor contact. The rotor contact 29 adjacent to said cutout portion $30^a$ has no electrical connection as was mentioned above. The stator contact 22 is made of any elastic material and is provided with a spring action so that it will press against the periphery of said first disc 14. When the rotor shaft 12 is positioned such that the cutout portion $30^a$ is opposite the stator contact 22, the bias resulting from said spring action causes the stator contact 22 to be displaced more toward the disc while in contact with said cutout $30^a$ than when in contact with any other rotor contact. This displacement of the stator contact 22 causes said stator contact 22 to come into contact with the stator contact 23. For this to occur, it is necessary that the stator contact 23, connected to the I.F. output terminal 3 of the UHF tuner 1, be positioned between the stator contact 22, connected to transistor 33, and the stator contact 27, connected to VHF antenna 11.

Figure 10:
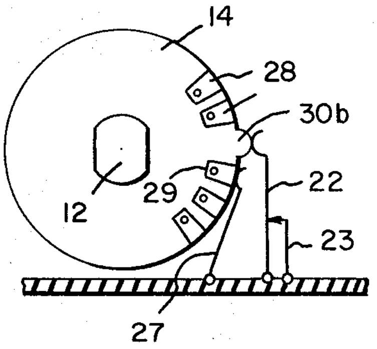
FIGS. 10, 11 and 12 are schematic diagrams of the first disc illustrating further embodiments of the present invention.

Alternative arrangements are of course possible. As shown in FIG. 10, the first disc 14 has a projection 30*b* which is not provided with any rotor contact and which is located at the periphery of said disc 14 in a position corresponding to the UHF position of the rotor shaft 12. The rotor contact 29, adjacent to the projection 30*b*, has no electrical connection. The stator contact 22 is made of an elastic material such as a beryllium-copper alloy or phosphor bronze and is provided with a spring action so as to press against the periphery of the first disc 14. When the rotor shaft 12 moves the projection 30*b* around so that it is opposite the stator contact 22, said stator contact 22 is pushed back by said projection 30*b* so as to come into contact with the stator contact 23. For this to occur, it is necessary that the stator contact 22 which is connected to the transistor 33 be positioned between the stator contact 27, connected to VHF antenna, and the stator contact 23, connected to the I.F. output terminal 3 of the UHF tuner 6.

In the embodiments shown in FIGS. 9 and 10, the rotor contacts 28 are of a plate form and do not extend to the periphery of the disc. The switching action achieved by the construction as shown in FIG. 9 can also be achieved by employing projecting rotor contacts 28*b* as shown in FIG. 11.

Figure 11:
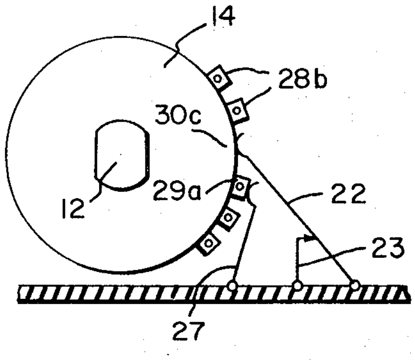

Referring to FIG. 11, the first disc 14 has projecting rotor contacts 28*b* on its periphery but has no projecting rotor contact at the position 30*c* which corresponds to the UHF position of the rotor shaft 12. The stator contact 23 is positioned between the stator contact 27 and the stator contact 22, and the embodiment operates in a way similar to that of FIG. 9.

Figure 12:
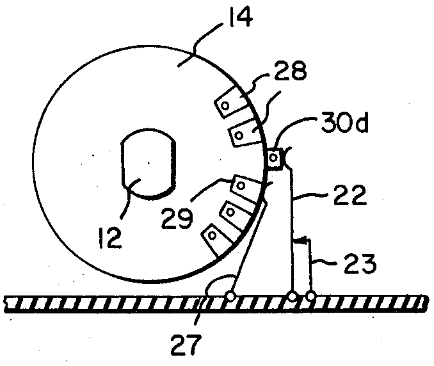

The switching action achieved by the construction shown in FIG. 10 can be accomplished by employing a projecting rotor contact in accordance with the present invention as shown in FIG. 12. The first disc 14 has, at its periphery, rotor contacts 28 of a plate form similar to those of FIGS. 9 and 10. A projecting rotor contact 30*d*, having no electrical connection, is attached at a position corresponding to the UHF position of the rotor shaft 12. The stator contact 22 is positioned between the stator contact 27 and the stator contact 23 and the embodiment operates in a way similar to that of FIG. 10.

Figure 13:
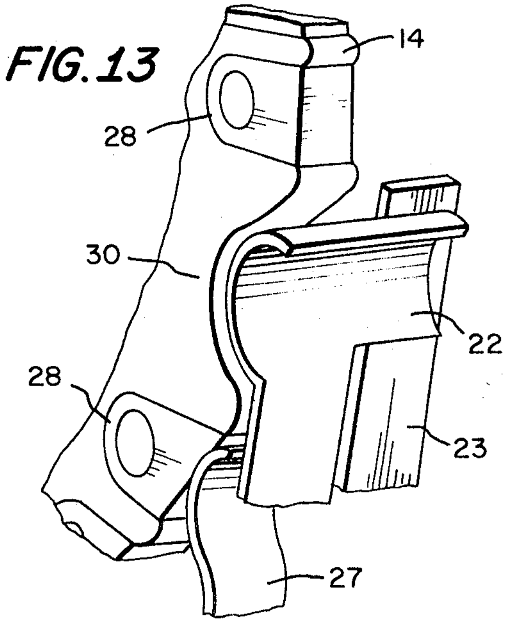
FIG. 13 is a perspective view of a portion of the first disc with said portion illustrated in detail.

The construction of FIG. 9 will be more clearly understood by referring to FIG. 13. A first disc 14 made of any suitable insulating material, such as epoxy resin, is provided with the rotor contacts 28 secured to said disc 14 in any suitable manner, such as by screwing the contact plate materials onto said disc 14. At position 30 corresponding to the UHF position of the rotor shaft 12 a recess is cut out of said disc 14, the recess having a smooth curvature to facilitate the smooth and secure contact action with the stator contact 22. Said stator contact 22 has, at one end, a curved surface with a shape to fit the recess 30. The stator contacts 22 and 27 are made of any suitable contact material and are arranged so as to come into contact with the two adjacent rotor contacts 28 as the rotor shaft 12 is rotated. When the first disc 14 is positioned in the UHF position of the rotor shaft 12, the curved surface at one end of the stator contact 22 moves into the cutout 30 and the whole contact is displaced toward the center of said first disc 14. Such displacement causes the stator contact 22 and the stator contact 23 which are made of any suitable contact material, to come into contact. At the same time, the rotor contact 27 pushes against the rotor contact 29 which does not have any electrical connection, thus switching off the VHF tuner.

What I claim is:

1. A rotating disc-type tuner switching device for use with a combined UHF–VHF television tuner, said device comprising a first disc having thereon a plurality of pairs of rotor contacts spaced in a peripheral direction around said disc, a coil for an input circuit of the VHF tuner connected between each pair of contacts, a first pair of stator contacts spaced in a peripheral direction around said first disc and biased into contact with respective pairs of rotor contacts on the said first disc, one contact of said first pair of stator contacts being adapted to be connected to an amplifier for the VHF tuner and the other contact of said first pair of stator contacts being adapted to be connected to the VHF antenna, a second disc having thereon a plurality of pairs of rotor contacts spaced in a peripheral direction around said second disc, a coil for a local oscillator circuit connected between each pair of contacts, a second pair of stator contacts spaced in a peripheral direction around said second disc and biased into contact with respective pairs of rotor contacts on said second disc, one contact of said second pair of stator contacts being adapted to be connected to a local oscillator and a power supply and the other contact of said second pair of stator contacts being adapted to be connected to a mixer, a rotor shaft on which said discs are mounted, a third stator contact associated with said first pair of stator contacts and a fourth stator contact associated with said second pair of stator contacts and being adapted to be connected to an output of the UHF tuner and the power supply for the UHF tuner, respectively, said other contact of the first and second pairs of stator contacts being out of contact with said third and fourth stator contacts when said contacts of said pairs of contacts are engaged with said pairs of rotor contacts, said discs having a space between two of the pairs of contacts sufficiently long in the direction of the periphery of the discs to accommodate both of the contacts of the pairs of stator contacts, said space having no contacts connected with other contacts, the peripheral portions of said first and second discs in said spaces having a configuration cooperating with said one contact in each pair of stator contacts when the rotor shaft is in a UHF position for moving said one contact into contact with said third and fourth contacts, respectively, to connect said one contact in the one pair of stator contacts with the third stator contact associated therewith to connect said output of the UHF tuner to said amplifier for the VHF tuner and to connect said one contact in the second pair of stator contacts with the third stator contact associated therewith to connect the power supply to said UHF tuner, said discs and stator contacts constituting the sole means for switching between VHF and UHF reception.

2. A rotating disc-type tuner switching device as claimed in claim 1 in which said contacts on said discs are in the peripheral edge of said discs and the peripheral edge of said disc has said configuration and said stator contacts bear on the peripheral edges of said discs.

3. A tuner switching device as claimed in claim 1 in which said discs each have a recess in the peripheral edge thereof at a position corresponding to said UHF position of said rotor shaft, the recessed peripheral edge constituting said configuration, and said one stator contact in each pair of stator contacts bears against the peripheral edge of the respective discs and is biased into the recess, and said third contact for each pair of stator contacts is positioned adjacent the respective one contacts and are contacted by said one contacts when said one contacts are in said recesses.

4. A tuner switching device as claimed in claim 1 in which said discs each have a projection on the peripheral edge thereof at a position corresponding to said UHF position of said rotor shaft, the projection containing portion of the peripheral edge constituting said configuration, and said one stator contact in each pair of stator contacts bears against the peripheral edge of the respective discs and is moved outwardly by the projection, and said third contact for each pair of stator contacts is positioned adjacent the respective one contacts and are contacted by said one contacts when said one contacts are moved outwardly away from the discs by the projections.

5. A tuner switching device as claimed in claim 4 in which said projection is a contact having no connecting lead thereon.

6. A tuner switching device as claimed in claim 1 in which said discs each have the plurality of pairs of contacts at the VHF positions of said discs projecting outwardly from the periphery of the discs, there being no corresponding projecting contact at the UHF position of the discs, said periphery of the disc having no contacts constituting said configuration, the said one stator contact in each pair of stator contacts bearing against the peripheral edge of the disc and moving inwardly toward the disc in the UHF position of the discs, and said third contact for each pair of stator contacts is positioned adjacent the respective one contacts and are contacted by said one contacts when said one contacts are moved inwardly toward said discs.